US011842883B2

(12) United States Patent
Park et al.

(10) Patent No.: US 11,842,883 B2
(45) Date of Patent: Dec. 12, 2023

(54) CHEMICAL VAPOR DEPOSITION APPARATUS AND METHOD OF MANUFACTURING DISPLAY APPARATUS USING THE SAME

(71) Applicant: Samsung Display Co., Ltd., Yongin-si (KR)

(72) Inventors: Jong-hoon Park, Asan-si (KR); Sukwon Jung, Sejong-si (KR); Hyunwoo Joo, Seoul (KR); Jaihyuk Choi, Hwaseong-si (KR); Kyungjoo Min, Yongin-si (KR); Wonwoong Park, Seoul (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 17/718,047

(22) Filed: Apr. 11, 2022

(65) Prior Publication Data

US 2022/0238306 A1    Jul. 28, 2022

Related U.S. Application Data

(62) Division of application No. 15/994,486, filed on May 31, 2018, now Pat. No. 11,302,517.

(30) Foreign Application Priority Data

Jul. 11, 2017  (KR) .......................... 10-2017-0087963

(51) Int. Cl.
 *H01J 37/32* (2006.01)
 *C23C 16/44* (2006.01)
 (Continued)

(52) U.S. Cl.
 CPC .... *H01J 37/32082* (2013.01); *C23C 16/4411* (2013.01); *C23C 16/4412* (2013.01);
 (Continued)

(58) Field of Classification Search
 CPC ................................................. C23C 16/45565
 See application file for complete search history.

(56) References Cited

U.S. PATENT DOCUMENTS 5,908,508 A  6/1999 Vanell et al.
6,106,625 A  8/2000 Koai et al.
(Continued)

FOREIGN PATENT DOCUMENTS

CN  1574229 A  2/2005
CN  104060238 A  9/2014
(Continued)

OTHER PUBLICATIONS

Extended European Search Report, Application No. 18177532.1, dated Mar. 29, 2019, pp. 1-14.

*Primary Examiner* — Robert A Vetere
(74) *Attorney, Agent, or Firm* — Innovation Counsel LLP

(57) ABSTRACT

A chemical vapor deposition apparatus includes a chamber, a susceptor supporting a substrate, a backing plate to which power is applied, a diffuser providing a deposition gas, and a first insulator. The first insulator may include a first portion covering a top surface of the backing plate, and a second portion assembled with the first portion and covering a sidewall of the backing plate.

10 Claims, 8 Drawing Sheets

(51) Int. Cl.
  *C23C 16/505* (2006.01)
  *C23C 16/455* (2006.01)
  *C23C 16/509* (2006.01)
  *H10K 71/00* (2023.01)
  *C23C 16/34* (2006.01)
  *H10K 71/16* (2023.01)

(52) U.S. Cl.
  CPC ...... *C23C 16/45565* (2013.01); *C23C 16/505* (2013.01); *C23C 16/5096* (2013.01); *H01J 37/3244* (2013.01); *H01J 37/32091* (2013.01); *H01J 37/32458* (2013.01); *H01J 37/32467* (2013.01); *H01J 37/32568* (2013.01); *H01J 37/32577* (2013.01); *H10K 71/00* (2023.02); *C23C 16/345* (2013.01); *H01J 2237/3321* (2013.01); *H10K 71/164* (2023.02)

(56) References Cited

U.S. PATENT DOCUMENTS

| | | | |
|---|---|---|---|
| 6,270,859 | B2 | 8/2001 | Zhao et al. |
| 9,068,262 | B2 | 6/2015 | Kudela et al. |
| 2003/0047282 | A1 | 3/2003 | Sago et al. |
| 2004/0187779 | A1* | 9/2004 | Park ................. C23C 16/45519 118/715 |
| 2005/0000430 | A1 | 1/2005 | Jang et al. |
| 2005/0230350 | A1 | 10/2005 | Kao et al. |
| 2005/0239294 | A1* | 10/2005 | Rosenblum ............ B05D 1/60 438/778 |
| 2006/0090700 | A1 | 5/2006 | Satoh et al. |
| 2009/0026361 | A1 | 1/2009 | Syns et al. |
| 2010/0096367 | A1 | 4/2010 | Jeon et al. |
| 2012/0231181 | A1 | 9/2012 | Anwar et al. |
| 2013/0063254 | A1* | 3/2013 | Hanks .................... G06K 19/04 235/492 |
| 2013/0171545 | A1 | 7/2013 | Betts et al. |
| 2014/0283746 | A1* | 9/2014 | Seo ................... H01J 37/32477 118/723 R |
| 2015/0211121 | A1* | 7/2015 | Zhao ............... C23C 16/45591 118/728 |
| 2016/0168707 | A1 | 6/2016 | Jang et al. |
| 2018/0374676 | A1 | 12/2018 | Fujita et al. |

FOREIGN PATENT DOCUMENTS

| | | |
|---|---|---|
| CN | 105940143 A | 9/2016 |
| JP | 2002-503765 A | 2/2002 |
| JP | 2005220368 A | 8/2005 |
| KR | 10-2002-0074242 A | 9/2002 |
| KR | 10-2005-0116230 A | 12/2005 |
| KR | 10-0522903 B1 | 12/2005 |
| KR | 10-2007-0036844 A | 4/2007 |
| KR | 10-2012-0053974 A | 5/2012 |
| KR | 10-1248182 B1 | 3/2013 |
| KR | 10-2013-0086523 A | 8/2013 |
| TW | 332304 B | 5/1998 |
| WO | 2011011532 A2 | 1/2011 |

* cited by examiner

CHEMICAL VAPOR DEPOSITION APPARATUS AND METHOD OF MANUFACTURING DISPLAY APPARATUS USING THE SAME

CROSS-REFERENCE TO RELATED APPLICATION

This application is a divisional of U.S. patent application Ser. No. 15/994,486, filed on May 31, 2018, which claims priority to Korean Patent Application No. 10-2017-0087963, filed on Jul. 11, 2017, and all the benefits accruing therefrom under 35 U.S.C. § 119, the content of which in its entirety is herein incorporated by reference.

BACKGROUND

1. Field

Embodiments of the invention relate to a chemical vapor deposition apparatus and a method of manufacturing a display apparatus using the same and, more particularly, to a chemical vapor deposition apparatus using plasma and a method of manufacturing a display apparatus using the same.

2. Description of the Related Art

Manufacturing processes of a display apparatus include deposition processes forming thin layers on a surface of a substrate, photolithography processes, and etching processes. For example, the deposition processes include a sputtering deposition process and a chemical vapor deposition (CVD) process. The sputtering deposition process is a physical deposition process in which thin layer particles are collided directly with and adsorbed directly onto a substrate.

In the chemical vapor deposition process, a chemical reaction of radicals may be induced over a substrate and thin layer particles of the reaction product may fall and be adsorbed onto the substrate. In particular, a plasma chemical vapor deposition process using rich radicals and high energy of plasma may be used as the chemical vapor deposition process.

SUMMARY

Embodiments of the invention may provide a chemical vapor deposition apparatus capable of preventing leakage of radio-frequency (RF) power applied to a backing plate.

Embodiments of the invention may also provide a method of manufacturing a display apparatus, which is capable of uniformly forming an inorganic encapsulation layer on a substrate.

In an aspect of the invention, a chemical vapor deposition apparatus may include a chamber, a susceptor, a backing plate, a diffuser, and an insulator.

The susceptor, the backing plate, the diffuser and the insulator may be disposed in the chamber. A temperature in the chamber may range from 80 degrees Celsius to 100 degrees Celsius.

The susceptor may support a substrate having an organic light-emitting diode.

The backing plate may be disposed over the susceptor and may be spaced apart from the susceptor by a predetermined distance. The backing plate may receive power having a frequency of 13.56 MHz or more.

The diffuser may be disposed between the backing plate and the susceptor and may provide a deposition gas to the substrate. The deposition gas may include at least one of silane ($SiH_4$), ammonia ($NH_3$), hydrogen ($H_2$), nitrous oxide ($N_2O$), or nitrogen ($N_2$). The deposition gas may further include an inert gas.

The insulator may include a first insulator and a second insulator assembled with the first insulator.

The first insulator may include a first portion covering a top surface of the backing plate, and a second portion assembled with the first portion and covering a sidewall of the backing plate.

Each of the first portion and the second portion may include a plurality of assembled blocks. The first portion may entirely cover the top surface of the backing plate.

The first insulator may include at least one of polytetrafluoroethylene (PTFE), polychlorotrifluoroethylene (PCTFE), polyvinylidene fluoride (PVDF), or polyvinyl fluoride (PVF).

The second insulator may be connected to the chamber and the diffuser. The second insulator may have a frame shape exposing the diffuser and may include a plurality of assembled blocks.

The second insulator may include ceramic and may insulate the diffuser from the chamber.

The backing plate may include a conductive plate, a cooling water pipe which is embedded in the conductive plate and through which cooling water flows, and an insulating port.

The insulating port may be disposed on a top surface of the conductive plate and may include connection pipes aligned with an inlet and an outlet of the cooling water pipe.

The insulating port may include plastic, and at least a portion of the insulating port may be surrounded by the first portion.

The backing plate may further include a supply pipe and an exhaust pipe disposed on the insulating port. The supply pipe may be connected to one of the connection pipes, and the exhaust pipe may be connected to the other of the connection pipes.

In another aspect of the invention, a method of manufacturing a display apparatus may include preparing a substrate having an organic light-emitting diode on a susceptor disposed in a chamber, forming a plasma region between the susceptor and a backing plate disposed over the susceptor by applying power to the backing plate of which a top surface and a sidewall are covered by an insulator, and providing a deposition gas into the plasma region to form a first inorganic thin layer on the organic light-emitting diode.

The power having a frequency of 13.56 MHz or more may be applied to the backing plate in the forming of the plasma region.

The method may further include forming an organic thin layer on the first inorganic thin layer, and forming a second inorganic thin layer on the organic thin layer.

The first inorganic thin layer and the second inorganic thin layer may be formed in the chamber, and the organic thin layer may be formed in a second chamber different from the chamber.

According to an embodiment of the invention, power leakage from the backing plate may be prevented in order to form a uniform plasma in the chamber. As a result, a process time can be reduced and process reliability can be improved.

BRIEF DESCRIPTION OF THE DRAWINGS

The above and other aspects and features of the present invention will become more apparent by describing in further detail exemplary embodiments thereof with reference to the accompanying drawings, in which.

DETAILED DESCRIPTION

Figure 1:
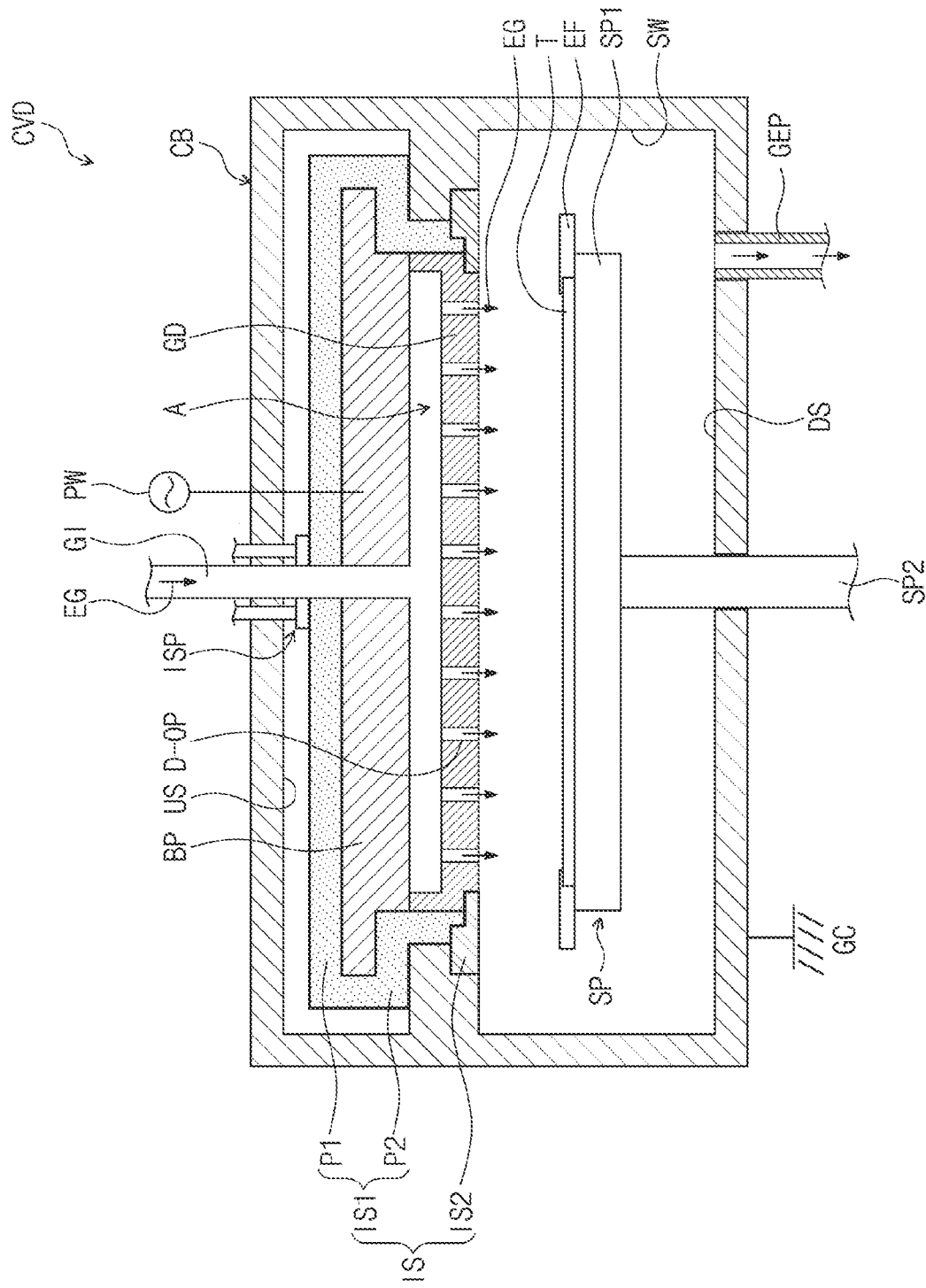
FIG. 1 is a schematic cross-sectional view illustrating a chemical vapor deposition apparatus according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element such as a layer, region or substrate is referred to as being "on" another element, it can be directly on the other element or intervening elements may be present. In contrast, the term "directly" means that there are no intervening elements. As used herein, the term "and/or" includes any and all combinations of one or more of the associated listed items. The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein are interpreted accordingly. It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein. "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Exemplary embodiments are described herein with reference to cross-sectional illustrations and/or plane illustrations that are idealized exemplary illustrations. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of exemplary embodiments.

FIG. 1 is a schematic cross-sectional view illustrating a chemical vapor deposition apparatus according to an embodiment of the invention.

According to an embodiment of the invention, a chemical vapor deposition apparatus CVD may be provided as a plasma-enhanced chemical vapor deposition (PECVD) apparatus. The chemical vapor deposition apparatus CVD may be used in a semiconductor manufacturing process for manufacturing an integrated circuit device, a display apparatus, or a solar cell on a substrate. In particular, the chemical vapor deposition apparatus CVD according to the invention may be used to deposit an inorganic thin layer on a substrate having an organic light-emitting diode.

Referring to FIG. 1, the chemical vapor deposition apparatus CVD may include a chamber CB, a susceptor SP, a diffuser GD, a backing plate BP, an insulator IS, a gas injection part GI, and a gas exhaust part GEP.

The chamber CB includes a top surface US, a bottom surface DS, and a sidewall SW connecting the top surface US and the bottom surface DS. An inner space surrounded by the top surface US, the bottom surface DS, and the sidewall SW may be defined in the chamber CB, and components necessary for operation of the chemical vapor deposition apparatus CVD may be disposed in the inner space of the chamber CB.

In particular, when the chemical vapor deposition apparatus CVD is operated, the inner space of the chamber CB may be sealed from the outside. In this case, the gas injection part GI and the gas exhaust part GEP may block the inflow of external air. In addition, even though not shown in the drawings, a portion of the chamber CB may be opened and closed to transfer a substrate. In this case, a portion of the sidewall SW of the chamber CB may be opened and closed.

The chamber CB may include a conductive material. For example, the chamber CB may include at least one of aluminum, inconel, or hastelloy. A portion of the chamber CB may be electrically connected to an external ground terminal GC.

In an embodiment of the invention, a process of forming an inorganic thin layer on a substrate T having an organic light-emitting diode may be performed at a low temperature. For example, the inner space of the chamber CB may be maintained at a temperature of 80 degrees Celsius to 100 degrees Celsius in the process.

The susceptor SP may support the substrate T. In an embodiment of the invention, the organic light-emitting diode may be provided on the substrate T. The susceptor SP may include a conductive metal material.

The susceptor SP may include a first susceptor SP1 supporting the substrate T, and a second susceptor SP2 connected to the first susceptor SP1 and penetrating the bottom surface DS of the chamber CB. The substrate T may be disposed on a top surface of the first susceptor SP1. The first susceptor SP1 and the second susceptor SP2 may be separately provided or may be integrally formed with each other as a single unitary body. Shapes of the first susceptor SP1 and the second susceptor SP2 may be variously modified depending on components included in the chemical vapor deposition apparatus CVD.

The first susceptor SP1 may have a quadrilateral or circular plate shape for supporting the substrate T. Even though not shown in the drawings, the susceptor SP may include a heating line capable of heating the substrate T and/or a cooling line capable of cooling the substrate T. The heating line and/or the cooling line may be embedded in the first susceptor SP1.

The second susceptor SP2 may be connected to a central area of the first susceptor SP1 to support the first susceptor SP1. The second susceptor SP2 may have a circular or quadrilateral pillar.

In particular, the second susceptor SP2 may vertically ascend or descend to locate the substrate T to a process position. In this case, the first susceptor SP1 may be moved in the same direction as the second susceptor SP2 by the movement of the second susceptor SP2. For example, when the substrate T is transferred from an outer space into the inner space of the chamber CB through the sidewall SW of the chamber CB, the second susceptor SP2 may vertically ascend. As a result, the substrate T may be disposed on the first susceptor SP1. Thereafter, the second susceptor SP2 may descend to locate the substrate T to the process position.

The susceptor SP may further include an edge frame EF for fixing a sidewall of the substrate T. The edge frame EF may be located to cover an edge of the substrate T.

The susceptor SP may be connected to the ground terminal GC. In this case, the second susceptor SP2 may be coupled to the bottom surface DS of the chamber CB so as to be electrically connected to the bottom surface DS.

The diffuser GD may be disposed over the substrate T and may be disposed between the susceptor SP and the backing plate BP. The diffuser GD may be connected to the backing plate BP. Even though not shown in the drawings, both end portions of the diffuser GD may be coupled to the backing plate BP by screws. However, embodiments of the invention are not limited thereto. In another embodiment, the diffuser GD may be connected to a bracket and may be fixed to the backing plate BP through the bracket.

A certain space A into which a deposition gas EG is supplied may be defined between the diffuser GD and the backing plate BP. The deposition gas EG injected from the gas injection part GI may be provided into the space A.

The diffuser GD may include a metal material of at least one of aluminum, inconel, or hastelloy.

The diffuser GD may transmit the deposition gas EG to the substrate T. A plurality of through-holes D-OP may be defined in the diffuser GD, and the deposition gas EG may be uniformly transmitted to the substrate T through the through-holes D-OP.

The deposition gas EG may include a reaction gas used as a deposition source for depositing an inorganic thin layer on the substrate having the organic light-emitting diode, and a stabilization gas for adjusting a pressure in the chamber CB.

In the present embodiment, the reaction gas may include a mixed gas of silane ($SiH_4$), ammonia ($NH_3$) and nitrogen ($N_2$) for depositing a silicon nitride layer or a mixed gas of silane ($SiH_4$), nitrous oxide ($N_2O$), ammonia ($NH_3$) and hydrogen ($H_2$) for depositing a silicon oxynitride layer. The stabilization gas may include an inert gas.

The backing plate BP may be disposed over the susceptor SP and may be spaced apart from the susceptor SP by a predetermined distance. The backing plate BP may include a metal material of at least one of aluminum, inconel, or hastelloy.

The backing plate BP may be connected to a power supply part PW. Thus, the backing plate BP may receive power supplied from the power supply part PW. The power supply part PW may supply radio-frequency power (RF power) of 13.56 MHz or more, and thus the backing plate BP may receive the RF power.

The backing plate BP is electrically connected to the diffuser GD. The RF power applied to the backing plate BP may be transmitted to the diffuser GD connected to the backing plate BP.

Plasma may be formed between the diffuser GD and the susceptor SP by the RF power applied to the backing plate BP. The deposition gas EG may be excited into the plasma by a potential difference between the backing plate BP and the susceptor SP. As a result, a product of a chemical reaction of radicals and high energy of the plasma may fall and be adsorbed to a surface of the substrate T, and thus a thin layer may be deposited on the surface of the substrate T.

The RF power applied to the backing plate BP may be transmitted to the diffuser GD, and the RF power transmitted to the diffuser GD may be transmitted to the susceptor SP. The RF power transmitted to the susceptor SP may be transmitted to the chamber CB. The RF power transmitted to the chamber CB may be transmitted to the ground terminal GC. As a result, the RF power applied to the backing plate BP may not be completely transmitted to the diffuser GD and the susceptor SP but may be leaked through the chamber CB.

According to the present embodiment, the insulator IS may prevent the RF power applied to the backing plate BP from being leaked through the chamber CB. This will be described later in more detail.

The gas injection part GI may be disposed at the top surface US of the chamber CB. The gas injection part GI may penetrate the top surface US of the chamber CB so as to be connected to the space A.

The gas exhaust part GEP may be disposed at the bottom surface DS of the chamber CB. The gas exhaust part GEP may penetrate the bottom surface DS of the chamber CB and may exhaust a gas provided in the inner space of the chamber CB to the outside of the chamber CB.

Figure 2:
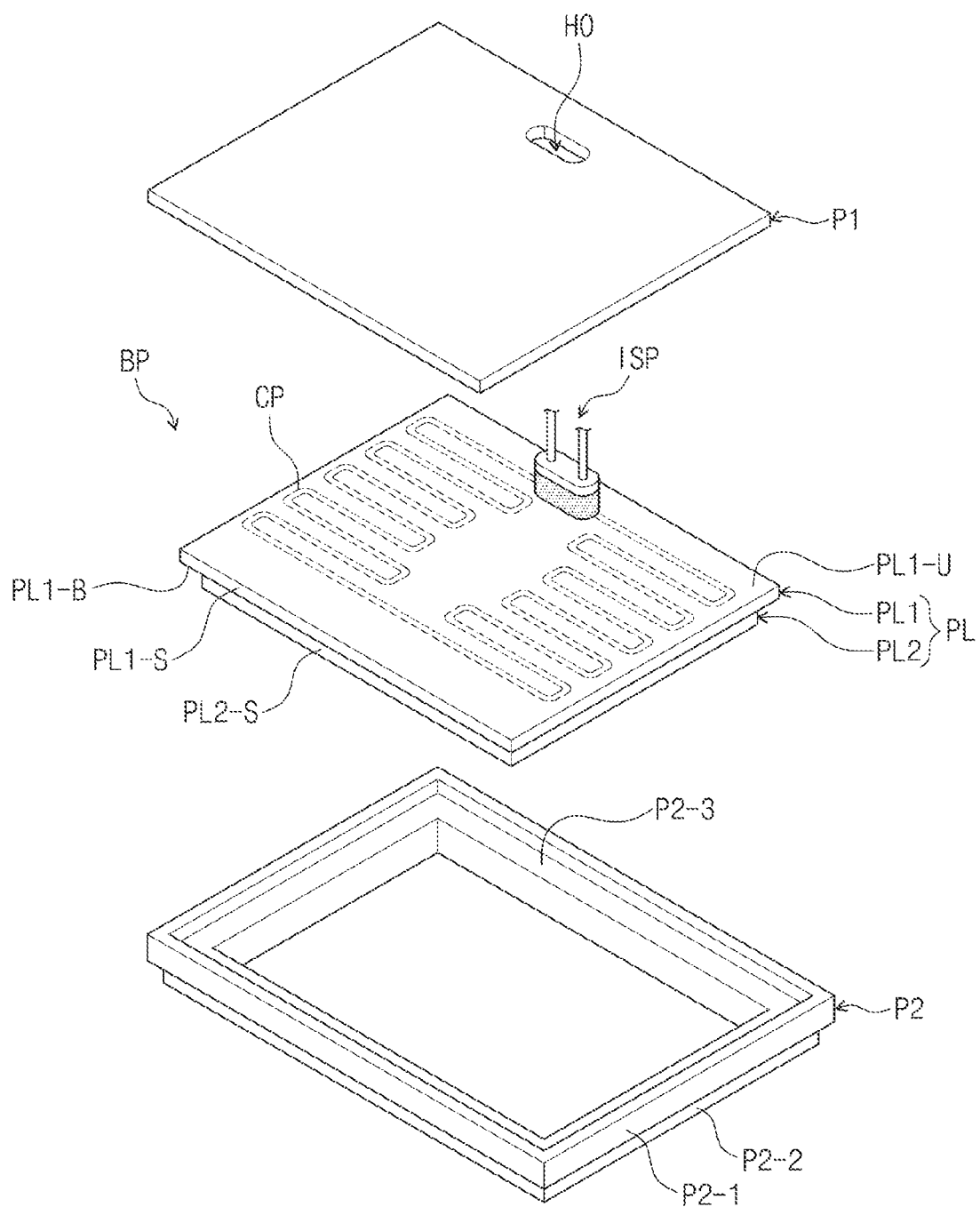
FIG. 2 is an exploded perspective view illustrating a portion of a chemical vapor deposition apparatus according to an embodiment of the invention.
Figure 3:
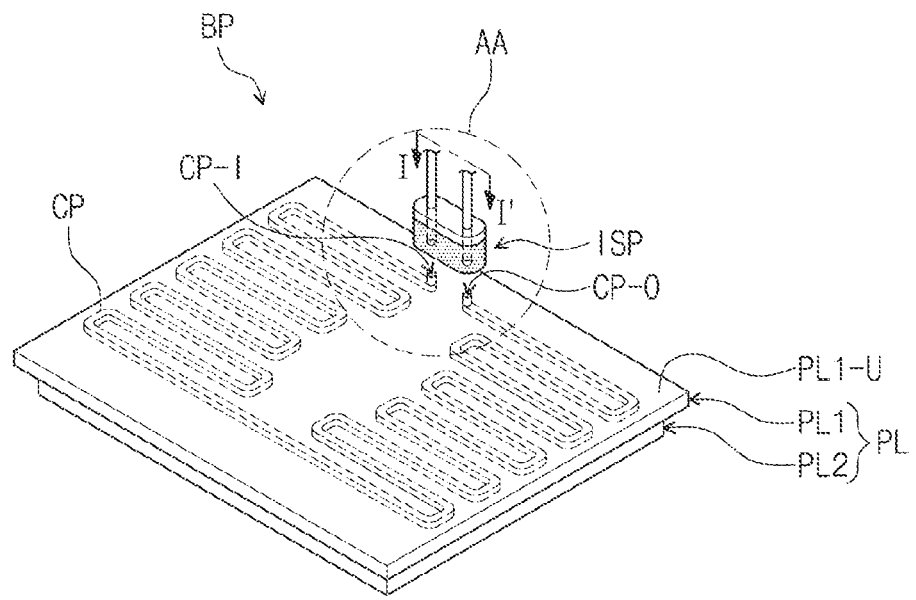
FIG. 3 is a perspective view illustrating a backing plate according to an embodiment of the invention.
Figure 4:
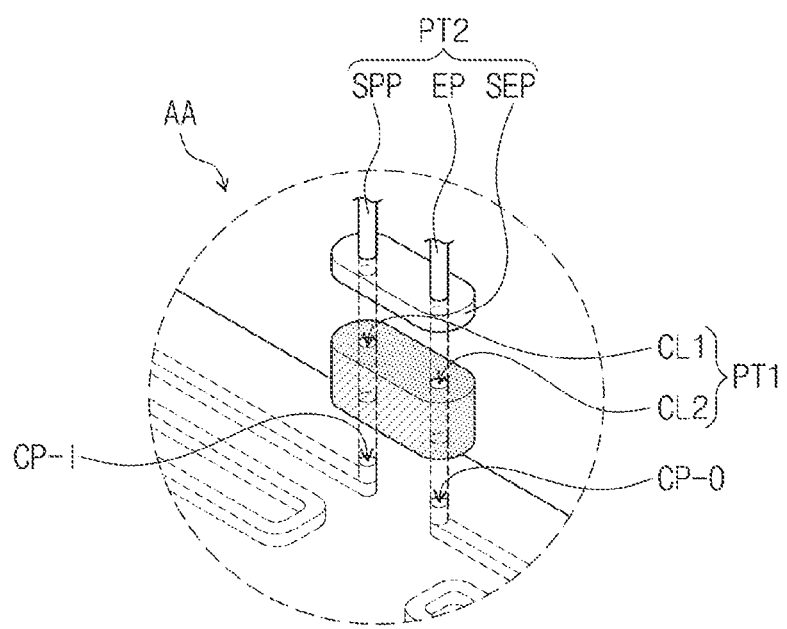
FIG. 4 is an enlarged exploded perspective view of an area AA of FIG. 3.
Figure 5:
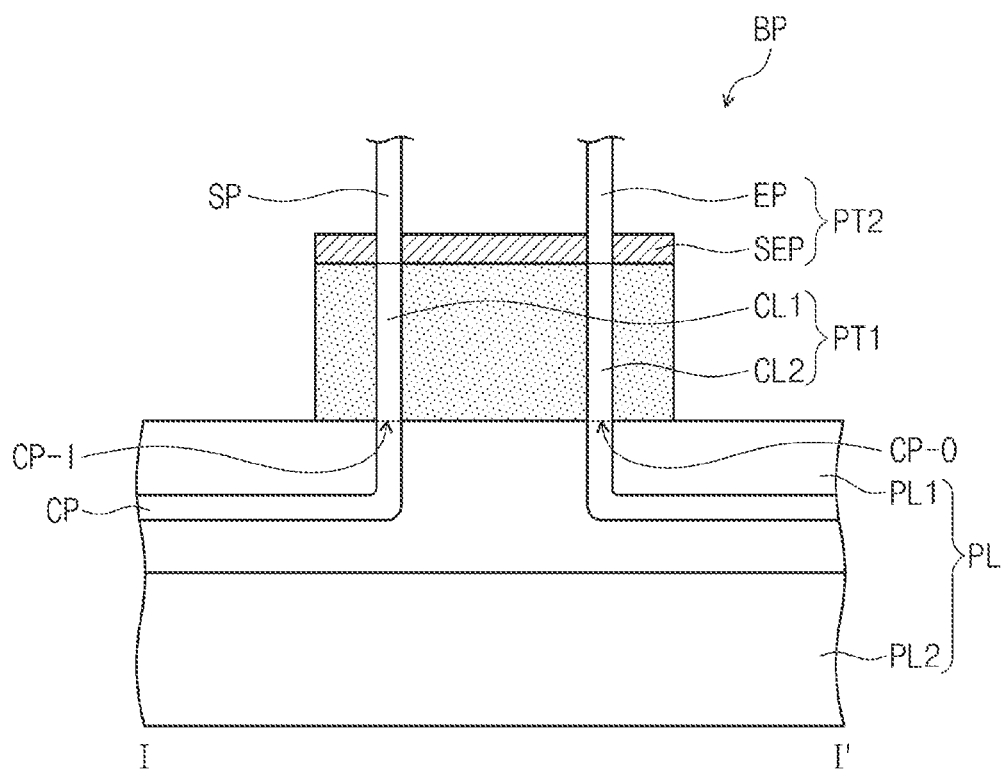
FIG. 5 is a cross-sectional view taken along a line I-I' of FIG. 3.

FIG. 2 is an exploded perspective view illustrating a portion of a chemical vapor deposition apparatus according to an embodiment of the invention, and FIG. 3 is a perspective view illustrating a backing plate according to an embodiment of the invention. FIG. 4 is an enlarged exploded perspective view of an area AA of FIG. 3, and FIG. 5 is a cross-sectional view taken along a line I-I' of FIG. 3. Hereinafter, the backing plate BP will be described in more detail with reference to the drawings.

Referring to FIGS. 1 and 2, the backing plate BP may include a conductive plate PL, a cooling water pipe CP, and an insulating part ISP.

The conductive plate PL may include a first conductive plate PL1 and a second conductive plate PL2 disposed under the first conductive plate PL1. The first conductive plate PL1 and the second conductive plate PL2 may be provided separately from each other or may be integrally formed with each other as a single unitary body.

Each of the first and second conductive plates PL1 and PL2 may have a quadrilateral plate shape. In the present embodiment, an area of the second conductive plate PL2 may be smaller than that of the first conductive plate PL1. However, embodiments of the invention are not limited thereto.

The cooling water pipe CP may be embedded in the first conductive plate PL1. Thus, a thickness of the first conductive plate PL1 may be greater than a diameter of the cooling water pipe CP. In the present embodiment, cooling water may be supplied into the cooling water pipe CP to adjust a temperature of the backing plate BP and a temperature of the diffuser GD connected to the backing plate BP. Thus, it is possible to minimize damage of the backing plate BP and the diffuser GD by heat.

In the present embodiment, the cooling water pipe CP is embedded in the first conductive plate PL1. However, embodiments of the invention are not limited thereto. In another embodiment, the cooling water pipe CP may be embedded in the second conductive plate PL2. In this case, a thickness of the second conductive plate PL2 may be greater than the diameter of the cooling water pipe CP.

Referring to FIGS. 1 to 5, the cooling water pipe CP may have an inlet CP-I into which cooling water is injected, and an outlet CP-O from which the cooling water is exhausted. The inlet CP-I of the cooling water pipe CP may be one end of the cooling water pipe CP, and the outlet CP-O of the cooling water pipe CP may be another end, opposite to the one end, of the cooling water pipe CP.

The insulating part ISP may be disposed on the first conductive plate PL1 to supply the cooling water into the cooling water pipe CP and/or to exhaust the cooling water from the cooling water pipe CP. The insulating part ISP may include an insulating port PT1 and a conductive port PT2.

The insulating port PT1 may be fixed on a top surface PL1-U of the first conductive plate PL1. The insulating port PT1 may include connection pipes aligned with the inlet CP-I and the outlet CP-O of the cooling water pipe CP. The connection pipes may include a first connection pipe CL1 connected to the inlet CP-I of the cooling water pipe CP and a second connection pipe CL2 connected to the outlet CP-O of the cooling water pipe CP.

The insulating port PT1 may include plastic. Thus, the insulating port PT1 may insulate the first conductive plate PL1 and the conductive port PT2 from each other. In the present embodiment, since the insulating port PT1 is disposed on the top surface PL1-U of the first conductive plate PL1, it is possible to prevent the RF power applied to the backing plate BP from being leaked through the conductive port PT2.

The conductive port PT2 may include a supply pipe SPP, an exhaust pipe EP, and a coupling portion SEP.

The supply pipe SPP may be located between a cooling water supply part (not shown) and the first connection pipe CL1 of the insulating port PT1 and may transfer the cooling water provided from the cooling water supply part to the cooling water pipe CP through the insulating port PT1.

The exhaust pipe EP may be located between the cooling water supply part (not shown) and the second connection pipe CL2 of the insulating port PT1 and may exhaust the cooling water exhausted through the cooling water pipe CP and the insulating port PT1 to the outside of the chamber CB.

The supply pipe SPP and the exhaust pipe EP may be fixed at the coupling portion SEP and may be coupled to the insulating port PT1. The supply pipe SPP and the exhaust pipe EP may be spaced apart from each other by a certain distance and may penetrate the coupling portion SEP. In the present embodiment, the supply pipe SPP, the exhaust pipe EP, and the coupling portion SEP may include a metal material.

In the present embodiment, the insulating part ISP can prevent the RF power applied to the backing plate BP from being leaked, and thus the plasma can be uniformly formed in the chamber CB. As a result, a process time can be reduced and process reliability can be improved.

Figure 6:
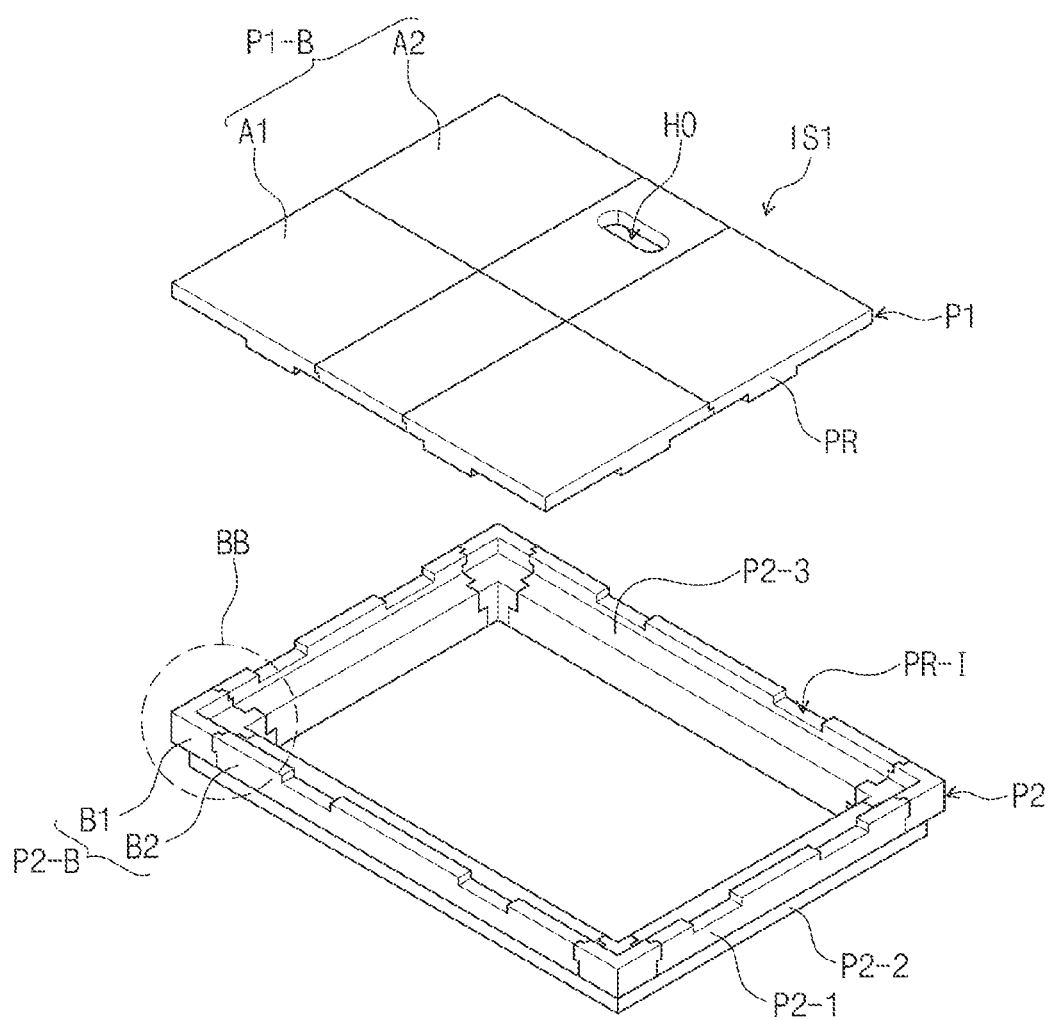
FIG. 6 is an exploded perspective view illustrating a first insulator according to an embodiment of the invention.
Figure 7:
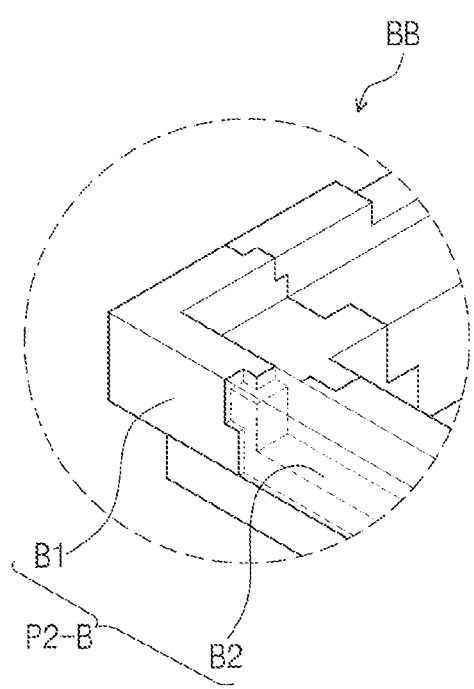
FIG. 7 is an enlarged inner perspective view of an area BB of FIG. 6.
Figure 8:
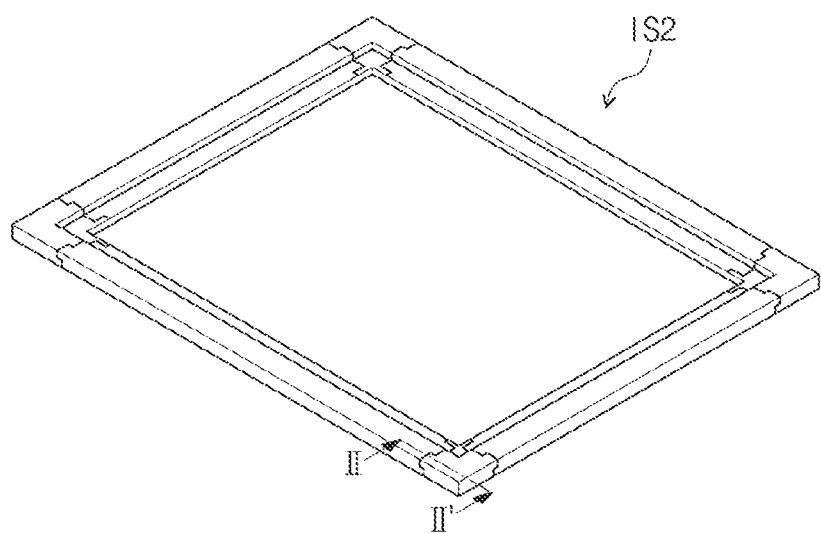
FIG. 8 is a perspective view illustrating a second insulator according to an embodiment of the invention.
Figure 9:
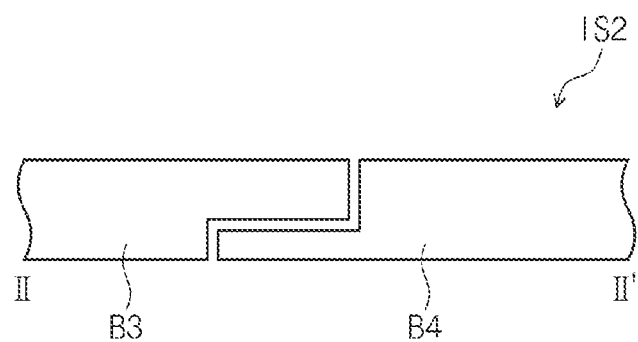
FIG. 9 is a cross-sectional view taken along a line II-II' of FIG. 8.

FIG. 6 is an exploded perspective view illustrating a first insulator according to an embodiment of the invention, and FIG. 7 is an enlarged inner perspective view of an area BB of FIG. 6. FIG. 8 is a perspective view illustrating a second insulator according to an embodiment of the invention, and FIG. 9 is a cross-sectional view taken along a line II-II' of FIG. 8. Hereinafter, the insulator IS according to an embodiment of the invention will be described with reference to the drawings.

Referring to FIGS. 1 and 2, the insulator IS may insulate the backing plate BP and the diffuser GD from the chamber CB.

The insulator IS may include a first insulator IS1 and a second insulator IS2.

The first insulator IS1 may include at least one of polytetrafluoroethylene (PTFE), polychlorotrifluoroethylene (PCTFE), polyvinylidene fluoride (PVDF), or polyvinyl fluoride (PVF).

The first insulator IS1 may include a first portion P1 covering a top surface of the backing plate BP and a second portion P2 covering a sidewall of the backing plate BP.

The first portion P1 may cover the top surface PL1-U of the first conductive plate PL1. The first portion P1 may entirely cover the top surface PL1-U of the first conductive plate PL1. In the present embodiment, the first portion P1 may cover a remaining portion of the top surface PL1-U of the first conductive plate PL1 except an area on which the insulating part ISP is located.

In the present embodiment, a hole HO may be provided at a position corresponding to the insulating part ISP in the first portion P1. The insulating part ISP may penetrate the hole HO and may be disposed on the same plane as the first portion P1. At least a portion of the insulating part ISP penetrating the hole HO may be surrounded by the first portion P1. In the present embodiment, the insulating port PT1 of the insulating part ISP may be surrounded by the first portion P1.

Since the first portion P1 entirely covers the top surface of the backing plate BP, it is possible to prevent the RF power applied to the backing plate BP from being leaked to the chamber CB through the top surface PL1-U of the first conductive plate PL 1.

Referring to FIG. 6, a protrusion PR may be provided at an edge of the first portion P1 and may be assembled with the second portion P2. The protrusion PR may be provided in plurality, and the protrusions PR may be spaced apart from each other along the edge of the first portion P1 at certain intervals.

The first portion P1 may include a plurality of assembled blocks P1-B. Each of two blocks A1 and A2, assembled with each other, of the plurality of blocks P1-B may have a contact surface having a bent shape, and the contact surfaces of the two blocks A1 and A2 may be in contact with each other to overlap with each other in a plan view. Thus, it is possible to inhibit or prevent the RF power applied to the backing plate BP from being leaked through the first portion P1.

Referring to FIGS. 2 and 6, the second portion P2 may have a frame shape. The second portion P2 may include a first sidewall portion P2-1 covering a first sidewall PL1-S of the first conductive plate PL1 and a second sidewall portion PS-2 covering a second sidewall PL2-S of the second conductive plate PL2. In addition, the second portion P2 may further include a frame portion P2-3 that connects the first sidewall portion P2-1 and the second sidewall portion P2-2 to each other. A bottom surface PL1-B of the first conductive plate PL1, which connects the first sidewall PL1-S and the second sidewall PL2-S to each other, may be disposed on the frame portion P2-3.

An engaging portion PR-I which is engaged with the protrusion PR of the first portion P1 may be provided at the first sidewall portion P2-1. The engaging portion PR-I may be a stepped portion that is formed in the first sidewall portion P2-1 to correspond to a shape and a position of the protrusion PR.

The second sidewall portion P2-2 may extend to further cover a sidewall of the diffuser GD. The second sidewall portion P2-2 may be assembled with the second insulator IS2. An end portion of the second sidewall portion P2-2 may have a stepped shape.

In the present embodiment, since the second portion P2 entirely covers the sidewall of the backing plate BP, it is possible to prevent the RF power applied to the backing plate BP from being leaked to the chamber CB through the first sidewall PL1-S, the second sidewall PL2-S, and the bottom surface PL1-B of the first conductive plate PL1.

Referring to FIGS. 6 and 7, the second portion P2 may include a plurality of assembled blocks P2-B. Each of two blocks B1 and B2, assembled with each other, of the plurality of blocks P2-B may have a contact surface having a bent shape, and the contact surfaces of the two blocks B1 and B2 may be in contact with each other to overlap with each other in a plan view. Thus, it is possible to inhibit or prevent the RF power applied to the backing plate BP from being leaked through the second portion P2.

Since each of the first and second portions P1 and P2 includes the plurality of assembled blocks, the first portion P1 and the second portion P2 may be easily coupled to the backing plate BP having a wide area.

Referring to FIGS. 1, 8, and 9, the second insulator IS2 may insulate the diffuser GD from the chamber CB. The second insulator IS2 may have a frame shape that is disposed along a sidewall of the diffuser GD and exposes a bottom surface of the diffuser GD. The second insulator IS2 may be assembled with the sidewall of the diffuser GD.

The second insulator IS2 may be disposed under the first insulator IS1 and may be assembled with the first insulator IS1. The second insulator IS2 may be assembled with the second sidewall portion P2-2 of the first insulator IS1. The second insulator IS2 may cover an end portion of the second sidewall portion P2-2 to prevent the deposition gas EG from coming in contact with the first insulator IS1.

The second insulator IS2 may include a plurality of assembled blocks. Since the second insulator IS2 includes the plurality of assembled blocks, the second insulator IS2 may be easily coupled to the diffuser GD having a wide area.

Each of two blocks B3 and B4, assembled with each other, of the plurality of blocks of the second insulator IS2 may have a contact surface having a bent shape, and the contact surfaces of the two blocks B3 and B4 may be in contact with each other to overlap with each other in a plan view. Thus, it is possible to inhibit or prevent the RF power applied to the backing plate BP and the diffuser GD from being leaked through the second insulator IS2.

The second insulator IS2 may include ceramic. Thus, the second insulator IS2 may minimize or prevent damage of the first insulator IS1, which may be caused by the deposition gas EG and heat.

Figure 10:
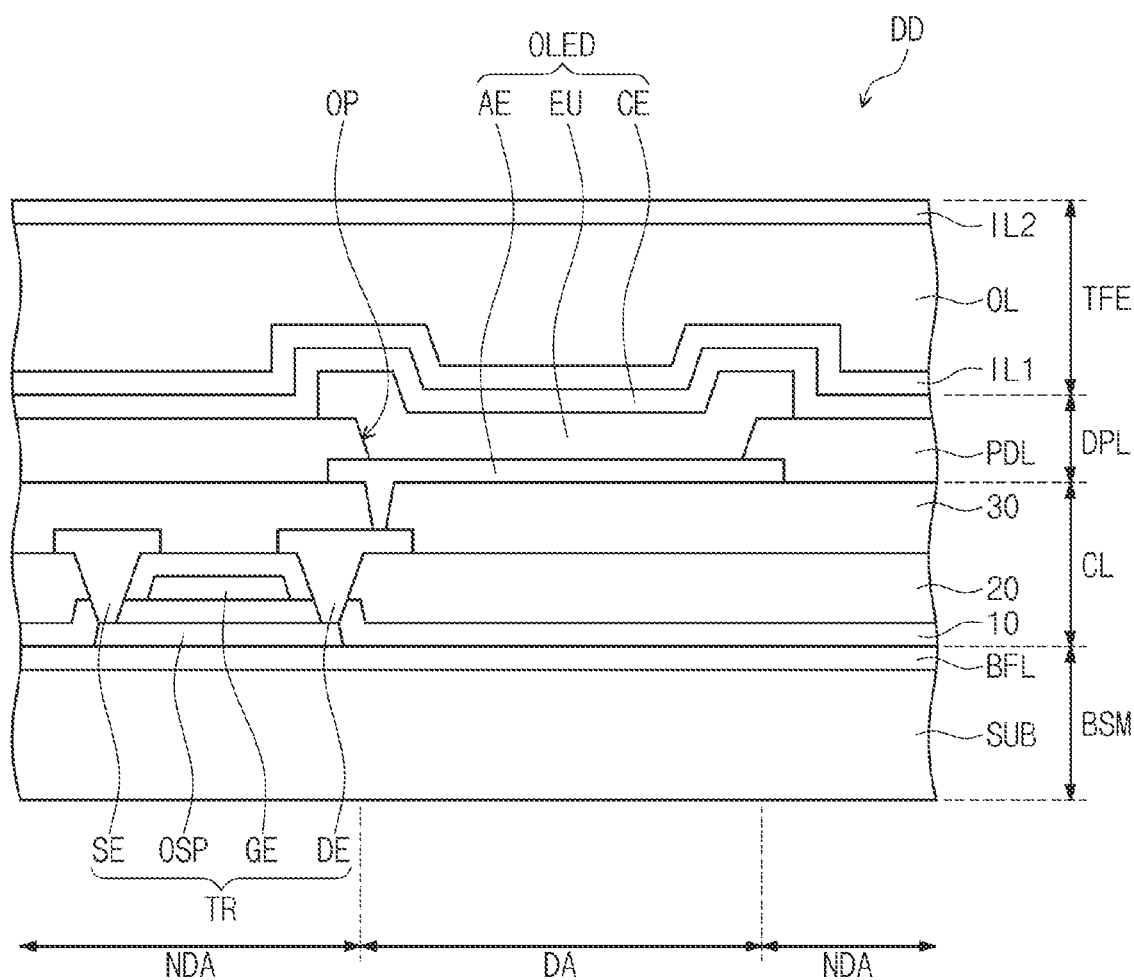
FIG. 10 is a cross-sectional view illustrating a display apparatus according to an embodiment of the invention.

FIG. 10 is a cross-sectional view illustrating a display apparatus according to an embodiment of the invention. A method of manufacturing a display apparatus DD using the chemical vapor deposition apparatus CVD according to the embodiment of the invention will be described with reference to the drawings. The same descriptions as in the above embodiment will be omitted for the purpose of ease and convenience in description.

Referring to FIGS. 1 and 10, in a method of manufacturing a display apparatus DD according to an embodiment of the invention, a thin film encapsulation layer TFE may be formed on a substrate T having a base member BSM, a circuit layer CL, and a display layer DPL.

The base member BSM may include a display area DA on which an image is provided, and a non-display area NDA adjacent to the display area DA. The base member BSM may include a base layer SUB and a buffer layer BFL.

The base layer SUB may be a flexible substrate and may include a plastic substrate, a glass substrate, a metal substrate, or an organic/inorganic composite substrate. The buffer layer BFL may include at least one of silicon oxide or silicon nitride.

In FIG. 10, the buffer layer BFL corresponding to an example of a functional layer is disposed on a surface of the base layer SUB. However, embodiments of the invention are not limited thereto. In another embodiment, a barrier layer may be disposed as a functional layer on the base layer SUB. Alternatively, the buffer layer BFL may be omitted in a display apparatus according still another embodiment of the invention.

The circuit layer CL may include a thin film transistor TR and at least one insulating layer.

A semiconductor pattern OSP of the thin film transistor TR is disposed on the base layer SUB. The semiconductor pattern OSP may include one selected from a group consisting of amorphous silicon, poly-silicon, and a metal oxide semiconductor. The insulating layer may include a first insulating layer 10 and a second insulating layer 20.

The first insulating layer 10 is disposed on the base layer SUB to cover the semiconductor pattern OSP. The first insulating layer 10 may include an organic layer and/or an inorganic layer. In an embodiment, the first insulating layer 10 may include a plurality of inorganic thin layers. The plurality of inorganic thin layers may include a silicon nitride layer and a silicon oxide layer.

A control electrode GE of the thin film transistor TR is disposed on the first insulating layer 10. The second insulating layer 20 is disposed on the first insulating layer 10 and covers the control electrode GE. The second insulating layer 20 includes an organic layer and/or an inorganic layer. In an embodiment, the second insulating layer 20 may include a plurality of inorganic thin layers. The plurality of inorganic thin layers may include a silicon nitride layer and a silicon oxide layer. The second insulating layer 20 may include a different material from the first insulating layer 10.

An input electrode SE and an output electrode DE of the thin film transistor TR are disposed on the second insulating layer 20. A plurality of signal lines may be disposed on the second insulating layer 20.

A third insulating layer 30 may be disposed on the second insulating layer 20 to cover the input electrode SE and the output electrode DE. The third insulating layer 30 includes an organic layer and/or an inorganic layer. In an embodiment, the third insulating layer 30 may include an organic material to provide a flat surface.

The display layer DPL is disposed on the third insulating layer 30. In more detail, a pixel defining layer PDL and an organic light-emitting diode OLED are disposed on the third insulating layer 30. An anode AE is disposed on the third insulating layer 30. The anode AE is connected to the output electrode DE through a through-hole penetrating the third insulating layer 30. A light emitting area OP is defined in the pixel defining layer PDL. The light emitting area OP of the pixel defining layer PDL exposes at least a portion of the anode AE.

A light emitting unit EU is disposed on the anode AE. A cathode CE is disposed on the light emitting unit EU. The anode AE, the light emitting unit EU and the cathode CE may constitute the organic light-emitting diode OLED. Even though not shown in the drawings, the light emitting unit EU may include a hole control layer, an organic light-emitting layer, and an electron control layer.

The thin film encapsulation layer TFE may include a first inorganic thin layer IL1 an organic thin layer OL and a second inorganic thin layer IL2 which are sequentially stacked on the display layer DPL.

In the present embodiment, a substrate T having the display layer DPL is prepared on the susceptor SP disposed in the chamber CB. Thereafter, a plasma region is formed on the substrate T, and a deposition gas EG is provided into the plasma region to form the first inorganic thin layer IL1 on the display layer DPL.

The deposition gas EG necessary for deposition is injected into the chamber CB, and RF power is applied to the backing plate BP to form a portion of the deposition gas EG into a gas in a plasma state (hereinafter, referred to as 'plasma'). In the present embodiment, the RF power may have a frequency of about 13.56 MHz or more.

Since the plasma lowers activation energy of the deposition gas EG, the deposition gas EG can be in an excited state at a low temperature. The deposition gas EG in the excited state may include metastable atoms or molecules divided into highly reactive ions and radicals. Thus, the plasma enhanced chemical vapor deposition method may form a thin layer at a lower temperature than a general chemical vapor deposition method.

The metastable atoms or molecules may be adsorbed on the substrate T to form the first inorganic thin layer IL1. The metastable atoms or molecules may be redistributed on a surface of the substrate T and may react physically and chemically on the surface of the substrate T. The metastable atoms or molecules are deposited on the substrate T while moving to the most stable sites and forming new bonds.

In the present embodiment, the first inorganic thin layer IL1 is formed on the cathode CE.

The organic thin layer OL may be formed on the first inorganic thin layer IL1 The first inorganic thin layer IL1 and the organic thin layer OL may be formed in different chambers from each other.

The second inorganic thin layer IL2 may be formed on the organic thin layer OL. At this time, the second inorganic thin layer IL2 may be formed in the same chamber CB as the first inorganic thin layer IL1 by the same manufacturing process as the first inorganic thin layer IL1. In the present embodiment, the thin film encapsulation layer TFE includes the first inorganic thin layer IL1 the organic thin layer OL, and the second inorganic thin layer IL2. However, embodiments of the invention are not limited thereto. In certain embodiments, the thin film encapsulation layer TFE may include a plurality of inorganic thin layers and a plurality of organic thin layers.

According to an embodiment of the invention, the leakage of the RF power from the backing plate BP may be prevented so as to form uniform plasma in the chamber CB. As a result, a process time can be reduced and process reliability can be improved.

While the invention has been described with reference to example embodiments, it will be apparent to those skilled in the art that various changes and modifications may be made without departing from the spirits and scopes of the invention. Therefore, it should be understood that the above embodiments are not limiting, but illustrative. Thus, the scopes of the invention are to be determined by the broadest permissible interpretation of the following claims and their equivalents, and shall not be restricted or limited by the foregoing description.

What is claimed is:

1. A method of manufacturing a display apparatus, the method comprising:
  preparing a substrate having an organic light-emitting diode on a susceptor disposed in a chamber;
  forming a plasma region disposed over the susceptor by applying power to a backing plate of which a top surface and a sidewall are covered by an insulator; and
  providing a deposition gas into the plasma region to form a first inorganic thin layer on the organic light-emitting diode,
  wherein the insulator including:
  a first portion covering the top surface of the backing plate, the first portion including a plurality of protrusions which protrude from edges of the first portion toward the backing plate to cover sides of the backing plate; and
  a second portion assembled with the first portion and covering a sidewall of the backing plate, the second portion including a plurality of engaging portions which are recessed from a top surface of the second portion and are disposed in regions corresponding to the plurality of protrusion, and
  wherein the plurality of protrusions in the first portion and the plurality of engaging portions in the second portion are coupled to each other to receive the backing plate in a space formed by the first portion and the second portion.

2. The method of claim 1, wherein the power having a frequency of 13.56 MHz or more is applied to the backing plate in the forming of the plasma region.

3. The method of claim 1, further comprising:

forming an organic thin layer on the first inorganic thin layer; and forming a second inorganic thin layer on the organic thin layer, wherein the first inorganic thin layer and the second inorganic thin layer are formed in the chamber, and wherein the organic thin layer is formed in a chamber different from the chamber.

4. The method of claim 1, wherein the deposition gas includes at least one of silane (SiH4), ammonia (NH3), hydrogen (H2), nitrous oxide (N2O), or nitrogen (N2).

5. The method of claim 1, wherein the deposition gas further includes an inert gas.

6. The method of claim 1, wherein a diffuser is spaced apart from the backing plate by predetermined space and electrically connected to the backing plate, and the deposition gas is provided from a plurality of through-holes defined in the diffuser.

7. The method of claim 6, wherein the applied power is transmitted to the diffuser through the backing plate and the plasma region is formed between the diffuser and the susceptor.

8. The method of claim 1, wherein, during forming the first inorganic thin layer, the deposition gas is excited into plasma by a potential difference between the backing plate and the susceptor and deposited onto the substrate.

9. The method of claim 1, wherein the first insulator includes at least one of polytetrafluoroethylene (PTFE), polychlorotrifluoroethylene (PCTFE), polyvinylidene fluoride (PVDF), or polyvinyl fluoride (PVF).

10. The method of claim 1, wherein the second insulator includes ceramic.

* * * * *